United States Patent
Testa et al.

(10) Patent No.: US 11,158,753 B2
(45) Date of Patent: Oct. 26, 2021

(54) PHOTOVOLTAIC PANELS COMPRISING LUMINESCENT SOLAR CONCENTRATORS

(71) Applicant: ENI S.P.A, Rome (IT)

(72) Inventors: Daniele Testa, Novara (IT); Lino Carnelli, Carbonate (IT); Luca Panzeri, Lomagna (IT)

(73) Assignee: ENI S.P.A., Rome (IT)

( * ) Notice: Subject to any disclaimer, the term of this patent is extended or adjusted under 35 U.S.C. 154(b) by 0 days.

(21) Appl. No.: 16/609,507

(22) PCT Filed: May 2, 2018

(86) PCT No.: PCT/IB2018/053031
§ 371 (c)(1),
(2) Date: Oct. 30, 2019

(87) PCT Pub. No.: WO2018/203245
PCT Pub. Date: Nov. 8, 2018

(65) Prior Publication Data
US 2020/0083391 A1 Mar. 12, 2020

(30) Foreign Application Priority Data
May 3, 2017 (IT) .......................... 102017000047754

(51) Int. Cl.
*H01L 31/055* (2014.01)
*H01L 31/054* (2014.01)
(Continued)

(52) U.S. Cl.
CPC .... *H01L 31/055* (2013.01); *H01L 31/035218* (2013.01); *H01L 31/0543* (2014.12); *H01L 31/186* (2013.01)

(58) Field of Classification Search
CPC ............... H01L 31/055; H01L 31/0543; H01L 31/035218; H01L 31/186
See application file for complete search history.

(56) References Cited

U.S. PATENT DOCUMENTS

2013/0014808 A1* 1/2013 Brounne ............. H01L 31/0481
136/251
2013/0306130 A1 11/2013 Reichstetter
(Continued)

FOREIGN PATENT DOCUMENTS

DE 102010027779 A1 10/2011
WO 2015/103152 A1 7/2015

OTHER PUBLICATIONS

Shin et al., U.S. Appl. No. 62/431,079. (Year: 2016).*
(Continued)

*Primary Examiner* — Jayne L Mershon
(74) *Attorney, Agent, or Firm* — Husch Blackwell LLP

(57) ABSTRACT

Photovoltaic panel (or solar panel) comprising:
at least one luminescent solar concentrator (LSC) having an upper surface, a lower surface and one or more outer sides;
at least one photovoltaic cell (or solar cell) placed on the outside of at least one of the outer sides or on the outside of at least one part of the lower surface of said luminescent solar concentrator (LSC);
at least one rigid or semi-rigid support placed on the outside of said at least one photovoltaic cell (or solar cell), said at least one rigid or semi-rigid support being placed in direct contact with said at least one photovoltaic cell (or solar cell);
at least one transparent frame placed outside said at least one rigid or semi-rigid support, said at least one transparent frame being placed in direct contact with said at least one rigid or semi-rigid support;
optionally, at least one transparent protective shell placed between said at least one transparent frame and said at least one rigid or semi-rigid support, said at least one transparent protective shell being placed in direct con-
(Continued)

Figure 1:
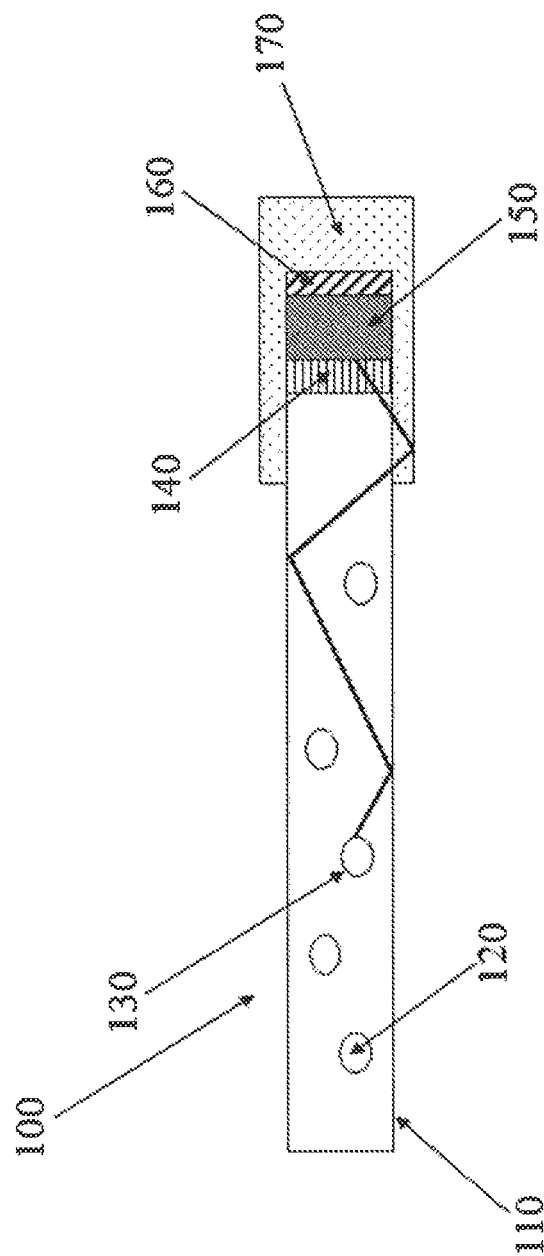

tact with said at least one rigid or semi-rigid support and said at least one transparent frame.

Said photovoltaic panel (or solar panel) may be used advantageously in various applications that require the production of electrical energy by utilizing the energy of solar radiation or radiation derived from artificial light such as, for example: architecturally integrated photovoltaic systems ("Building Integrated Photo Voltaic"—BIPV); photovoltaic windows; greenhouses; photo-bioreactors; soundproofing barriers; lighting engineering; design; advertising; automotive industry. Moreover, said photovoltaic panel (or solar panel) may be used either in "stand alone" conditions, or in modular systems.

20 Claims, 3 Drawing Sheets

(51) Int. Cl.
*H01L 31/0352* (2006.01)
*H01L 31/18* (2006.01)

(56) References Cited

U.S. PATENT DOCUMENTS

2015/0103152 A1  4/2015  Qin
2015/0162474 A1* 6/2015  Uchida ............... H02S 30/10
                                                    136/247
2016/0056316 A1* 2/2016  Clark .................. H01L 31/042
                                                    136/246
2019/0326534 A1* 10/2019 Shin ..................... H01L 33/06

OTHER PUBLICATIONS

International Search Report and Written Opinion for International Application No. PCT/IB2018/053031 dated Jul. 18, 2018, 13 pages.

* cited by examiner

PHOTOVOLTAIC PANELS COMPRISING LUMINESCENT SOLAR CONCENTRATORS

The present invention relates to photovoltaic panels (or solar panels) comprising luminescent solar concentrators (LSCs).

More particularly, the present invention relates to a photovoltaic panel (or solar panel) comprising: at least one luminescent solar concentrator (LSC) having an upper surface, a lower surface and one or more outer sides; at least one photovoltaic cell (or solar cell) placed on the outside of at least one of the outer sides or on the outside of at least one part of the lower surface of said luminescent solar concentrator (LSC); at least one rigid or semi-rigid support placed on the outside of said at least one photovoltaic cell (or solar cell), said at least one rigid or semi-rigid support being placed in direct contact with said at least one photovoltaic cell (or solar cell); at least one transparent frame placed outside said at least one rigid or semi-rigid support, said at least one transparent frame being placed in direct contact with said at least one rigid or semi-rigid support; optionally, at least one transparent protective shell placed between said at least one transparent frame and said at least one rigid or semi-rigid support, said at least one transparent protective shell being placed in direct contact with said at least one rigid or semi-rigid support and said at least one transparent frame.

The present invention also relates to a method for assembling said photovoltaic panel (or solar panel).

Said photovoltaic panel (or solar panel) may be used advantageously in various applications that require the production of electrical energy by utilizing the energy of solar radiation or radiation derived from artificial light such as, for example: architecturally integrated photovoltaic systems ("Building Integrated Photo Voltaic"—BIPV); photovoltaic windows; greenhouses; photo-bioreactors; soundproofing barriers; lighting engineering; design; advertising; automotive industry. Moreover, said photovoltaic panel (or solar panel) may be used either in "stand alone" conditions, or in modular systems.

At the state of the art, one of the main limits to utilization of the energy of solar radiation is represented by the capacity of photovoltaic devices (or solar devices) for optimum absorption exclusively of radiation having wavelengths that lie within a narrow spectral range.

For example, against a spectral range of solar radiation that extends from wavelengths of about 300 nm to wavelengths of about 2500 nm, photovoltaic cells (or solar cells) based on crystalline silicon, for example, have an optimum absorption zone (effective spectrum) in the range 900 nm-1100 nm, whereas polymeric photovoltaic cells (or solar cells) are susceptible to damage if exposed to radiation of wavelength below about 500 nm, owing to phenomena of induced photodegradation that become significant below this limit.

Typically, the efficiency of the photovoltaic devices (or solar devices) of the prior art is maximum in the region of the spectrum between 570 nm and 680 nm (yellow-orange).

The aforementioned drawbacks mean limited external quantum efficiency (EQE) of the photovoltaic device (or solar device), defined as the ratio of the number of electron-hole pairs generated in the semiconductor material of the photovoltaic device (or solar device) to the number of incident photons on the photovoltaic device (or solar device).

To improve the external quantum efficiency (EQE) of photovoltaic devices (or solar devices), devices have been developed, i.e. luminescent solar concentrators (LSCs) which, when interposed between the source of light radiation (the sun) and the photovoltaic device (or solar device), selectively absorb the incident radiation having wavelengths outside of the effective spectrum of the photovoltaic device (or solar device), emitting the energy absorbed in the form of photons of wavelength within the effective spectrum. When the energy of the photons emitted from a luminescent solar concentrator (LSC) is greater than that of the incident photons, the photoluminescence process, comprising absorption of solar radiation and subsequent emission of photons at smaller wavelength, is also called the "up-conversion" process. Conversely, when the energy of the photons emitted from a luminescent solar concentrator (LSC) is less than that of the incident photons, the photoluminescence process is defined as a "down-shifting" process.

Typically, the luminescent solar concentrators (LSCs) known in the prior art are in the form of a plate comprising a matrix made of material that is transparent as such to the radiation of interest (for example, transparent glasses or transparent polymer materials), and one or more photoluminescent compounds generally selected, for example, from organic compounds, metal complexes, inorganic compounds (for example, rare earths), and quantum dots (QDs). Owing to the optical phenomenon of total reflection, the radiation emitted by the photoluminescent compounds is "guided" towards the thin edges of said plate where it is concentrated on photovoltaic cells (or solar cells) placed there. In this way, it is possible to employ extensive areas of low-cost materials (said plate) to concentrate the light on small areas of high-cost materials [photovoltaic cells (or solar cells)].

The aforesaid photoluminescent compounds may be deposited on the matrix of transparent material in the form of a thin film, or may be dispersed within the transparent matrix. Alternatively, the transparent matrix may be directly functionalized with photoluminescent chromophore groups.

The characteristics that a photoluminescent compound should possess in order to be used advantageously in the construction of luminescent solar concentrators (LSCs) are multiple and not always mutually compatible.

Firstly, the frequency of the radiation emitted by fluorescence must correspond to energy above the threshold below which the semiconductor that constitutes the heart of the photovoltaic cell (or solar cell) is no longer able to function.

Secondly, the absorption spectrum of the photoluminescent compound should be as broad as possible, so as to absorb most of the incident solar radiation and then reemit it at the desired frequency.

Moreover, it is desirable for the absorption of solar radiation to be very intense, so that the photoluminescent compound can perform its role at the lowest possible concentrations, avoiding use thereof in massive amounts.

Moreover, the process of absorption of solar radiation and its subsequent emission at lower frequencies must take place with the maximum possible efficiency, minimizing the so-called non-radiative losses, often indicated collectively with the term "thermalization": the efficiency of the process is measured by its quantum yield.

Finally, it is necessary for the absorption and emission bands to have minimum overlap, because otherwise the radiation emitted by one molecule of the photoluminescent compound would be absorbed and, at least partly, diffused by the adjacent molecules.

Said phenomenon, generally designated self-absorption, inevitably means significant losses of efficiency. The difference between the frequencies of the peak at lower frequency of the absorption spectrum and of the peak of the emitted radiation is normally designated as the Stokes shift and is measured in nm (that is, it is not the difference between the two frequencies that is measured, but between the two wavelengths corresponding to them). These Stokes shifts must be high enough to guarantee minimum possible overlap between the absorption and emission bands and thus obtain high efficiencies of the luminescent solar concentrators (LSCs), subject to the aforementioned requirement that the frequency of the radiation emitted corresponds to energy above the threshold below which the photovoltaic cell (or solar cell) is unable to function. Further details regarding the aforementioned luminescent solar concentrators (LSCs) may be found, for example, in: Weber W. H. et al., "*Applied Optics*" (1976), Vol. 15, Issue 10, p. 2299-2300; Levitt J. A. et al., "*Applied Optics*" (1977), Vol. 16, Issue 10, p. 2684-2689; Reisfeld R. et al., "*Nature*" (1978), Vol. 274, p. 144-145; Goetzberger A. et al., "*Applied Physics*" (1978), Vol. 16, Issue 4, p. 399-404.

The main purpose of the luminescent solar concentrators (LSCs), as stated above, is to reduce the amount of high-cost materials [i.e. amount of materials used for constructing the photovoltaic cells (or solar cells)]. Moreover, the use of luminescent solar concentrators (LSCs) makes it possible to operate with both direct and diffuse light, in contrast to the use of silicon photovoltaic panels (or solar panels), whose performance is strongly dependent on the direction of the incident light: consequently, these luminescent solar concentrators (LSCs) may be used in contexts of urban integration as passive elements, i.e. elements that do not require solar trackers, of various colours and shapes.

For example, opaque luminescent solar concentrators (LSCs) could be used in walls and roofs, while semitransparent LSCs could be used as windows.

Further details regarding the aforementioned uses may be found, for example, in: Chatten A. J. et al., "*Proceeding Nanotech Conference and Expo*" (2011), Boston, USA, p. 669-670; Dedbije M. G., "*Advanced Functional Materials*" (2010), Vol. 20, Issue 9, p. 1498-1502; Dedbije M. G. et al., "*Advanced Energy Materials*" (2012), Vol. 2, p. 12-35.

Another application of luminescent solar concentrators (LSCs) are the so-called luminescent spectrum splitters (LSSs). In this case, small luminescent solar concentrators (LSCs) placed in series, each of which has a maximum absorption at different wavelengths, splits up the light previously concentrated by another solar concentrator, for example an optical solar concentrator, placed in front of said series. The advantage of said luminescent spectrum splitters (LSSs) is that the light is guided over short distances. Further details regarding said luminescent spectrum splitters (LSSs) may be found, for example, in Fischer B. et al., "*Solar Energy Materials & Solar Cells*" (2011), Vol. 95, p. 1741-1755.

As an alternative, luminescent solar concentrators (LSCs) may be used for producing light by utilizing solar radiation and reducing energy consumption such as, for example, in buildings used as offices: the concentrated light can in fact be conveyed through optical cables in said buildings, thus saving energy. Further details regarding this use may be found, for example, in Earp A. A. et al., "*Solar Energy Materials & Solar Cells*" (2004), Vol. 84, p. 411-426; Earp A. A. et al., "*Solar Energy*" (2004), Vol. 76, p. 655-667.

One of the problems with luminescent solar concentrators (LSCs) is outdoor use. Some solutions have been proposed in this connection.

For example, International patent application WO 2007/035466 describes solar radiation collecting devices comprising (a) an absorption body comprising a luminescent material (or luminescent body) and (b) photovoltaic (PV) cells placed at the edges of the absorption body. The luminescent material absorbs solar radiation and in its turn emits radiation at a different wavelength. The photovoltaic cells receive the emitted radiation and convert it into electrical energy. The aforementioned devices have one or more of the following features: (a) the luminescent material is such that part of the emitted radiation is converted into electrical energy and part of the emitted radiation is transmitted; (b) the photovoltaic cells are bifacial, i.e. they generate electrical energy in response to radiation from both sides; (c) the photovoltaic cells have electrodes that are not located between the photovoltaic cell and the luminescent body; and (d) the construction and/or the dimensions of the photovoltaic cells and/or of the luminescent body are selected so as to provide the desired result as, for example, a desired spatial variation in the generation of the luminescence radiation, a desired spatial variation in the absorption/transmission ratio, or a more uniform generation of current in the various photovoltaic cells. The aforementioned absorption body is said be particularly useful in photovoltaic windows.

American patent application US 2015/0194555 describes a solar panel comprising a luminescent solar concentrator configured for receiving photons from a photon source, said luminescent solar concentrator comprising an upper surface configured for receiving photons from the photon source; a lower surface that is spaced vertically away from the upper surface, wherein the upper surface is configured so as to be placed closer to the photon source relative to the lower surface; at least one edge surface that extends from a portion of the upper surface to a portion of the lower surface; and a wavelength conversion layer comprising at least one chromophore; a photovoltaic device configured for converting photons into electrical energy; a transparent adhesive placed between the luminescent solar concentrator and the photovoltaic device and configured for joining the luminescent solar concentrator to the photovoltaic device; a rigid base; and an adhesive layer placed between the photovoltaic device and the rigid base on a side of the photovoltaic device opposite the luminescent solar concentrator, wherein the adhesive layer is configured for joining the rigid base to the photovoltaic device; an opaque frame (for example, made of aluminium) for the purpose of protecting the photovoltaic device, and a layer of adhesive placed between said opaque frame and said photovoltaic device.

The aforementioned panel comprising a luminescent solar concentrator absorbs both direct and diffuse light and is able to utilize solar radiation highly efficiently and at low cost using a minimum quantity of solar cells which, however, are very expensive. The aforementioned panel comprising a luminescent solar concentrator is suitable for use in architecturally integrated photovoltaic systems ("Building Integrated Photo Voltaic"—BIPV) such as, for example, sunroofs, skylights, windows, facades of commercial and residential buildings.

However, the solutions proposed above may also have some drawbacks. For example, the use of opaque frames does not allow utilization of direct radiation on the photovoltaic cells (or solar cells) positioned at the edges of the luminescent solar concentrator (LSC), with consequent loss of performance of the photovoltaic device (or solar device) containing them. Moreover, the use of an adhesive layer between the frame and the photovoltaic cells (or solar cells) may cause a loss of efficiency of the photovoltaic device (or solar device) in the case when said adhesive layer creates optical coupling between the luminescent solar concentrator (LSC) and the frame: accordingly, the photons emitted by the luminescent material present in the luminescent solar concentrator (LSC) are partly deflected onto said frame and so cannot be utilized by the photovoltaic cells (or solar cells) placed at the edges thereof. Moreover, the use of materials with low refractive index for said adhesive layer may also reduce the loss of efficiency of the photovoltaic device (or solar device) but does not solve the problem.

The applicant therefore undertook the task of finding a photovoltaic panel (or solar panel) able to overcome the drawbacks described above and thus make more efficient use of the energy of solar radiation or of radiation derived from artificial light with consequent improved performance of photovoltaic devices (or solar devices) that contain it.

The applicant has now found a photovoltaic panel (or solar panel) comprising: at least one luminescent solar concentrator (LSC) having an upper surface, a lower surface and one or more outer sides; at least one photovoltaic cell (or solar cell) placed on the outside of at least one of the outer sides or on the outside of at least one part of the lower surface of said luminescent solar concentrator (LSC); at least one rigid or semi-rigid support placed on the outside of said at least one photovoltaic cell (or solar cell), said at least one rigid or semi-rigid support being placed in direct contact with said at least one photovoltaic cell (or solar cell); at least one transparent frame placed outside said at least one rigid or semi-rigid support, said at least one transparent frame being placed in direct contact with said at least one rigid or semi-rigid support; optionally, at least one transparent protective shell placed between said at least one transparent frame and said at least one rigid or semi-rigid support, said at least one transparent protective shell being placed in direct contact with said at least one rigid or semi-rigid support and said at least one transparent frame. In particular, the applicant found that the use of a transparent frame and optionally of at least one transparent protective shell in fact makes it possible to utilize the direct radiation on the photovoltaic cells (or solar cells) positioned at the edges of the luminescent solar concentrator (LSC), with consequent improvement of the performance of the photovoltaic panel (or solar panel). Moreover, both said transparent frame and said transparent protective shell that is optionally present function as a waveguide and, by internal reflection, the photons emitted by the photoluminescent compound(s) present in the luminescent solar concentrator (LSC) arrive at the photovoltaic cell(s) (or solar cell/s) that is/are present there. Moreover, both said transparent frame and said transparent protective shell that is optionally present do not require the use of further adhesive or sealing layers. Said photovoltaic panel (or solar panel) may be used advantageously in various applications that require the production of electrical energy by utilizing the energy of solar radiation or radiation derived from artificial light such as, for example: architecturally integrated photovoltaic systems ("Building Integrated Photo Voltaic"—BIPV); photovoltaic windows; greenhouses; photo-bioreactors; soundproofing barriers; lighting engineering; design; advertising; the automotive industry. Moreover, said photovoltaic panel (or solar panel) may be used either in "stand alone" conditions, or in modular systems.

The present invention therefore relates to a photovoltaic panel (or solar panel) comprising:
- at least one luminescent solar concentrator (LSC) having an upper surface, a lower surface and one or more outer sides;
- at least one photovoltaic cell (or solar cell) placed on the outside of at least one of the outer sides or on the outside of at least one part of the lower surface of said luminescent solar concentrator (LSC);
- at least one rigid or semi-rigid support placed on the outside of said at least one photovoltaic cell (or solar cell), said at least one rigid or semi-rigid support being placed in direct contact with said at least one photovoltaic cell (or solar cell);
- at least one transparent frame placed outside said at least one rigid or semi-rigid support, said at least one transparent frame being placed in direct contact with said at least one rigid or semi-rigid support;
- optionally, at least one transparent protective shell placed between said at least one transparent frame and said at least one rigid or semi-rigid support, said at least one transparent protective shell being placed in direct contact with said at least one rigid or semi-rigid support and said at least one transparent frame.

For the purposes of the present description and of the following claims, the definitions of the numerical ranges always include the upper and lower limits unless stated otherwise. For the purposes of the present description and of the following claims, the term "comprising" also includes the terms "that consists essentially of" or "that consists of".

As stated above, said luminescent solar concentrator (LSC) has an upper surface, a lower surface and one or more outer sides. According to one embodiment, said luminescent solar concentrator (LSC) may have one outer side (for example, it may be circular), two, three, four, five, six, seven, or more sides. According to one embodiment, said luminescent solar concentrator (LSC) may have a lower surface at some distance from the upper surface wherein the outer side or sides extend/s from the upper surface to the lower surface. According to one embodiment, the upper surface is configured for receiving the photons from a photon source and is positioned closer to the photon source relative to said lower surface.

According to a preferred embodiment of the present invention, said luminescent solar concentrator (LSC) has an upper surface configured for receiving photons, a lower surface configured for receiving photons, said upper surface being positioned closer to the photon source relative to the lower surface, and four outer sides that extend from the upper surface to the lower surface.

According to a preferred embodiment of the present invention, said luminescent solar concentrator (LSC) is a plate comprising a matrix made of transparent material and at least one photoluminescent compound.

According to a preferred embodiment of the present invention, said transparent material may be selected, for example, from: transparent polymers such as, for example, polymethylmethacrylate (PMMA), polycarbonate (PC), polyisobutyl methacrylate, polyethyl methacrylate, polyallyl diglycol carbonate, polymethacrylimide, polycarbonate ether, polyethylene terephthalate, polyvinylbutyral, ethylene-vinyl acetate copolymers, ethylene-tetrafluoroethylene copolymers, polyimide, polyurethane, styrene-acrylonitrile copolymers, styrene-butadiene copolymers, polystyrene, methyl methacrylate styrene copolymers, polyether sulphone, polysulphone, cellulose triacetate, transparent and impact-resistant crosslinked acrylic compositions consisting of a fragile matrix (I) having a glass transition temperature ($T_g$) greater than 0° C. and elastomeric domains having dimensions smaller than 100 nm consisting of macromolecular sequences (II) having a flexible nature with a glass transition temperature ($T_g$) of less than 0° C. described, for example, in American patent application US 2015/0038650 (hereinafter indicated, for greater simplicity as PPMA-IR), or mixtures thereof; transparent glasses such as, for example, silica, quartz, alumina, titania, or mixtures thereof. Polymethylmethacrylate (PMMA), PMMA-IR, or mixtures thereof, are preferred. Preferably said transparent material may have a refractive index ranging from 1.30 to 1.70.

According to a preferred embodiment of the present invention, said photoluminescent compound may be selected, for example, from perylenic compounds such as, for example, the compounds known by the trade name Lumogen® from BASF; acenic compounds described, for example, in International patent application WO 2011/048458 in the applicant's name; benzothiadiazole compounds described, for example, in International patent application WO 2011/048458 in the applicant's name; compounds comprising a benzoheterodiazole group and at least one benzodithiophene group described, for example, in International patent application WO 2013/098726 in the applicant's name; disubstituted naphthothiadiazole compounds described, for example, in European patent application EP 2 789 620 in the applicant's name; benzoheterodiazole compounds disubstituted with benzodithiophene groups described, for example, in European patent application EP 2 789 620 in the applicant's name; disubstituted benzoheterodiazole compounds described, for example, in International patent application WO 2016/046310 in the applicant's name; disubstituted diaryloxybenzoheterodiazole compounds described, for example, in International patent application WO 2016/046319 in the applicant's name; or mixtures thereof.

Specific examples of photoluminescent compounds that may be used advantageously for the purposes of the present invention are: N,N-bis(2',6'-di-iso-propylphenyl)(1,6,7,12-tetrapenoxy)(3,4,9,10-perylenediimide (Lumogen® F Red 305—BASF), 9,10-diphenylanthracene (DPA), 4,7-di(thien-2'-yl)-2,1,3-benzothiadiazole (DTB), 5,6-diphenoxy-4,7-bis(2-thienyl)-2,1,3-benzothiadiazole (DTBOP), 5,6-diphenoxy-4,7-bis[5-(2,6-dimethylphenyl)-2-thienyl]benzo[c]1,2,5-thiadiazole (MPDTBOP), 5,6-diphenoxy-4,7-bis[5-(2,5-dimethylphenyl)-2-thienyl]benzo[c]1,2,5-thiadiazole (PPDTBOP), 4,7-bis[5-(2,6-dimethylphenyl)-2-thienyl]benzo[c]1,2,5-thiadiazole (MPDTB), 4,7-bis[5-(2,6-diisopropylphenyl)-2-thienyl]benzo[c]1,2,5-thiadiazole (IP-PDTB), 4,7-bis[4,5-(2,6-dimethylphenyl)-2-thienyl]benzo[c]1,2,5-thiadiazole (2MPDTB) 4,7-bis(7',8'-dibutylbenzo[1',2'-b':4',3'-bldithien-5'-yl)-benzo[c][1,2,5]thiadiazole (F500), 4,9-bis(7',8'-dibutylbenzo[1',2'-b':4',3'-bldithien-5'-yl)-naphtho[2,3-c][1,2,5]thiadiazole (F521), 4,7-bis(5-(thiophen-2-yl)thiophen-2-yl)benzo[c][1,2,5]thiadiazole (QTB), 4,9-bis(thien-2'-yl)-naphtho[2,3-c][1,2,5]thiadiazole (DTN), or mixtures thereof. 9,10-Diphenylanthracene (DPA), 4,7-di(thien-2'-yl)-2,1,3-benzothiadiazole (DTB), or mixtures thereof, are preferred.

According to a preferred embodiment of the present invention, said photoluminescent compound may be present in said transparent matrix in an amount ranging from 0.1 g per unit area to 3 g per unit area, preferably ranging from 0.2 g per unit area to 2.5 g per unit area, said unit area being relative to the surface area of the matrix made of transparent material expressed in $m^2$.

According to a further embodiment of the present invention, said photoluminescent compound may be selected from quantum dots (QDs) that may consist of various elements that may be selected, for example, from the elements belonging to groups 12-16, 13-15, 14-16 or 13, of the Periodic Table of the Elements. Preferably, said quantum dots (QDs) may be selected, for example from: lead sulphide (PbS), zinc sulphide (ZnS), cadmium sulphide (CdS), cadmium selenide (CdSe), cadmium telluride (CdTe), silver (Ag), gold (Au), aluminium (Al), or mixtures thereof.

For the purposes of the present description and of the following claims, the term "Periodic Table of the Elements" refers to the "IUPAC Periodic Table of the Elements", version dated 8 Jan. 2016, given on the following website: https://iupac.org/what-we-do/periodic-table-of-elements/.

Further information relating to said quantum dots (QDs) may be found, for example, in American patent application US 2011/240960.

According to a preferred embodiment of the present invention, said photoluminescent compound, when selected from said quantum dots (QDs), may be present in said transparent matrix in an amount ranging from 0.05 g per unit area to 100 g per unit area, preferably ranging from 0.15 g per unit area and 20 g per unit area, said unit area being relative to the surface area of the matrix made of transparent material expressed in $m^2$.

According to a preferred embodiment of the present invention, said luminescent solar concentrator (LSC) is a plate having a thickness ranging from 0.1 µm to 50 mm, preferably ranging from 0.5 µm to 20 mm.

The aforementioned photoluminescent compounds may be used in said luminescent solar concentrator (LSC) in various forms.

For example, in the case when the transparent matrix is of the polymeric type, said at least one photoluminescent compound may be dispersed in the polymer of said transparent matrix by, for example, dispersion in the melt, or addition in the bulk, and successive formation of a plate comprising said polymer and said at least one photoluminescent compound, working, for example, by the so-called "casting" technique.

Alternatively, said at least one photoluminescent compound and the polymer of said transparent matrix may be dissolved in at least one suitable solvent, obtaining a solution that is deposited on a plate of said polymer, forming a film comprising said at least one photoluminescent compound and said polymer, operating, for example, using a film applicator of the "doctor blade" type; then said solvent is left to evaporate. Said solvent may be selected for example from: hydrocarbons such as, for example, 1,2-dichloromethane, toluene, hexane; ketones such as, for example, acetone, acetylacetone; or mixtures thereof.

In the case when the transparent matrix is of the glass type, said at least one photoluminescent compound may be dissolved in at least one suitable solvent (which may be selected from those given above), obtaining a solution that is deposited on a plate of said transparent matrix of the glass type, forming a film comprising said at least one photoluminescent compound working, for example, using a film applicator of the "doctor blade" type; then said solvent is left to evaporate.

Alternatively, a plate comprising said at least one photoluminescent compound and said polymer obtained as described above, by dispersion in the melt, or addition in the bulk, followed by "casting", may be enclosed between two plates of said transparent matrix of the glass type ("sandwiched") operating according to the known lamination technique. For the purposes of the present invention, said luminescent solar concentrator (LSC) may be made in the form of a plate by addition in the bulk and then casting, as described above.

Said at least one photovoltaic cell (or solar cell) placed on the outside of at least one of the outer sides or on the outside of at least one part of the lower surface of said luminescent solar concentrator (LSC), may be selected from various types of photovoltaic cells (or solar cells) such as, for example, photovoltaic cells (or solar cells) based on cadmium sulphide/cadmium telluride, photovoltaic cells (or solar cells) based on copper indium gallium diselenide, photovoltaic cells (or solar cells) based on amorphous silicon, photovoltaic cells (or solar cells) based on microcrystalline silicon, photovoltaic cells (or solar cells) based on crystalline silicon, polymeric photovoltaic cells (or solar cells), photovoltaic cells (or solar cells) based on perovskites, or combinations thereof.

The photovoltaic panel (or solar panel) according to the present invention may comprise photovoltaic cells (or solar cells) that are identical or different from one another.

According to a preferred embodiment of the present invention, the electrical energy generated by said at least one photovoltaic cell (or solar cell) may be transported by means of a wiring system that is connected to said photovoltaic panel (or solar panel).

According to a further preferred embodiment of the present invention, said photovoltaic panel may comprise at least one electrical conduit comprising, for example, electrical wires, conductive polymers, carbon fibres, connected to said at least one photovoltaic cell (or solar cell), said at least one electrical conduit being able to transport the electrical energy generated by said at least one photovoltaic cell (or solar cell).

According to a preferred embodiment of the present invention, said at least one rigid or semi-rigid support may be selected, for example, from aluminium, tin, ceramic, plastic, FR4 of the National Electrical Manufacturers Association (NEMA), or combinations thereof. Said rigid or semi-rigid support may be applied on said photovoltaic cell (or solar cell) before or after application of said at least one photovoltaic cell (or solar cell) on said luminescent solar concentrator (LSC), preferably before. Said rigid or semi-rigid support may be applied on said photovoltaic cell (or solar cell) by techniques known in the prior art such as, for example, direct welding or by means of a layer of transparent adhesive selected from those given hereunder.

A layer of transparent adhesive may be used for promoting adhesion between said at least one photovoltaic cell (or solar cell) and said luminescent solar concentrator (LSC). According to a preferred embodiment of the present invention, at least one layer of transparent adhesive may be placed between said at least one photovoltaic cell (or solar cell) and said luminescent solar concentrator (LSC).

According to a further preferred embodiment of the present invention, said at least one layer of transparent adhesive may comprise at least one compound selected for example from: rubbers, acrylic compounds, silicone, vinyl alkyl ethers, polyesters, polyamides, urethanes, epoxy compounds, ethylene vinyl acetate, polyethylene terephthalate, polymethylmethacrylate (PMMA), polyvinyl butyral, tetrafluomethylene, polyimides, amorphous polycarbonate, polystyrene, siloxanes, sol-gel, polyurethanes, polyacrylates, or mixtures thereof; preferably acrylic compounds, or mixtures thereof. Said layer of transparent adhesive may be permanent or non-permanent.

According to a preferred embodiment of the present invention, said at least one layer of transparent adhesive may be in the form of tape or film. Preferably, said at least one layer of transparent adhesive may have a thickness ranging from 1 μm to 2000 μm, preferably ranging from 10 μm to 1000 μm. Preferably, said at least one layer of transparent adhesive may have a refractive index ranging from 1.30 to 1.70. Preferably, said at least one layer of transparent adhesive is transparent so as to allow transmission of light in the visible range of wavelengths greater than 60%, up to more than 95%.

A layer of transparent adhesive that may be used advantageously for the purposes of the present invention and that is available commercially is the product known as 3M™ VHB™ 4910 from 3M.

According to a further preferred embodiment of the present invention, said at least one transparent frame may comprise a transparent material selected, for example, from: transparent polymers such as, for example, polymethylmethacrylate (PMMA), polycarbonate (PC), polyisobutyl methacrylate, polyethyl methacrylate, polyallyl diglycol carbonate, polymethacrylimide, polycarbonate ether, polyethylene terephthalate, polyvinylbutyral, ethylene-vinyl acetate copolymers, ethylene-tetrafluoroethylene copolymers, polyimide, polyurethane, styrene-acrylonitrile copolymers, styrene-butadiene copolymers, polystyrene, methyl methacrylate styrene copolymers, polyether sulphone, polysulphone, cellulose triacetate, PMMA-IR, or mixtures thereof. Polymethylmethacrylate (PMMA), PMMA-IR, or mixtures thereof, are preferred.

Preferably said transparent material may have a refractive index ranging from 1.30 to 1.70. Preferably, said at least one transparent frame is made of the same transparent material as is used for the luminescent solar concentrator (LSC).

According to a preferred embodiment of the present invention, said at least one transparent frame may be in the form of tape or film. Preferably, said at least one transparent frame may have a thickness ranging from 1 μm to 2000 μm, preferably ranging from 10 μm to 1000 μm. Preferably, said at least one transparent frame is transparent so as to allow transmission of light in the visible range of wavelengths greater than 60%, up to more than 95%.

According to a preferred embodiment of the present invention, said at least one transparent frame may cover at least part of said at least one rigid or semi-rigid support, said at least one transparent frame being placed in direct contact with said at least one rigid or semi-rigid support.

According to a further preferred embodiment of the present invention, said at least one transparent frame may cover said at least one rigid or semi-rigid support and at least part of said at least one photovoltaic cell (or solar cell), said at least one transparent frame being placed in direct contact with said at least one rigid or semi-rigid support and with said at least one photovoltaic cell (or solar cell).

According to a further preferred embodiment of the present invention, said at least one transparent frame may cover said at least one rigid or semi-rigid support, said at least one photovoltaic cell (or solar cell) and at least part of said luminescent solar concentrator (LSC), said at least one transparent frame being placed in direct contact with said at least one rigid or semi-rigid support, with said at least one photovoltaic cell (or solar cell) and with said luminescent solar concentrator (LSC).

Preferably, said at least one transparent frame overlaps said luminescent solar concentrator (LSC) by about 1÷5 mm so as to ensure adhesion thereof and prevent infiltration of water. Moreover, for further improvement of adhesion between said at least one transparent frame and the luminescent solar concentrator (LSC), milling and/or holes may be provided at the edges thereof so as to allow the material of which the transparent frame is made to penetrate into the luminescent solar concentrator (LSC) so as to improve its adhesion to it.

It should be noted that said at least one transparent frame, in addition to its function of sealing and protecting the luminescent solar concentrator (LSC) and the photovoltaic cell or cells placed therein, also functions as an anchorage point for inserting said photovoltaic panel (or solar panel) in a modular frame or in any other structure, for example a window or door frame component, or other structures in the applications mentioned above.

According to a preferred embodiment of the present invention, said at least one transparent protective shell may comprise a transparent material that may be selected, for example, from the materials stated above for said at least one transparent frame. Preferably said transparent material may have a refractive index ranging from 1.30 to 1.70. Preferably, said at least one transparent protective shell is of the same transparent material used for said transparent frame and/or for the luminescent solar concentrator (LSC).

According to a preferred embodiment of the present invention, said at least one transparent protective shell may be in the form of tape or film. Said at least one transparent shell may have a thickness ranging from 1 µm to 1000 µm, preferably ranging from 10 µm to 500 µm. Preferably, said at least one transparent shell is transparent so as to allow transmission of light in the visible range of wavelengths greater than 60%, Lip to more than 95%.

According to a preferred embodiment of the present invention, said at least one transparent protective shell may cover at least part of said at least one rigid or semi-rigid support, said at least one transparent protective shell being placed in direct contact with said at least one rigid or semi-rigid support.

According to a further preferred embodiment of the present invention, said at least one transparent protective shell may cover said at least one rigid or semi-rigid support and at least part of said at least one photovoltaic cell (or solar cell), said at least one transparent protective shell being placed in direct contact with said at least one rigid or semi-rigid support and with said at least one photovoltaic cell (or solar cell).

According to a further preferred embodiment of the present invention, said at least one transparent protective shell may cover said at least one rigid or semi-rigid support, said at least one photovoltaic cell (or solar cell) and at least part of said luminescent solar concentrator (LSC), said at least one transparent protective shell being placed in direct contact with said at least one rigid or semi-rigid support, with said at least one photovoltaic cell (or solar cell) and with said luminescent solar concentrator (LSC).

Preferably, said at least one transparent protective shell overlaps said luminescent solar concentrator (LSC) by about 1÷5 mm so as to ensure adhesion thereof and prevent infiltration of water. Moreover, for further improvement of adhesion between said at least one transparent protective shell and the luminescent solar concentrator (LSC), milling and/or holes may be provided at the edges thereof so as to allow the material of which the transparent protective shell is made to penetrate into the luminescent solar concentrator (LSC) so as to improve its adhesion.

The present invention also relates to a method for assembling said photovoltaic panel (or solar panel).

Consequently, the present invention further relates to a method for assembling said photovoltaic panel (or solar panel) comprising:

- preparing a luminescent solar concentrator (LSC) having an upper surface, a lower surface and one or more outer sides;
- optionally, milling and/or drilling the outer side(s) or at least one part of the lower surface of said luminescent solar concentrator (LSC);
- optionally, applying at least one layer of transparent adhesive on the outer side(s) or on at least one part of the lower surface of said luminescent solar concentrator (LSC);
- applying on the outer side(s) or on the outside of at least one part of the lower surface of said luminescent solar concentrator (LSC), or on said at least one layer of transparent adhesive, at least one photovoltaic cell (or solar cell), said photovoltaic cell (or solar cell) preferably being positioned beforehand on a rigid or semi-rigid support;
- or, applying at least one rigid or semi-rigid support on said at least one photovoltaic cell (or solar cell);
- fitting the wiring system by automatic welding;
- placing the whole in an injection moulding press;
- moulding at least one transparent frame, or moulding at least one transparent protective shell, and then at least one transparent frame.

The luminescent solar concentrator (LSC) may be prepared as described above.

The layer of transparent adhesive may be applied manually or automatically by means of, for example, an automated arm or a robot.

The rigid or semi-rigid support may be applied manually or automatically by means of, for example, an automated arm or a robot.

Injection moulding may be carried out by methods known in the prior art, suitably adjusting the operating parameters based on the dimensions of the luminescent solar concentrator (LSC) and the types of materials used.

Figure 2:
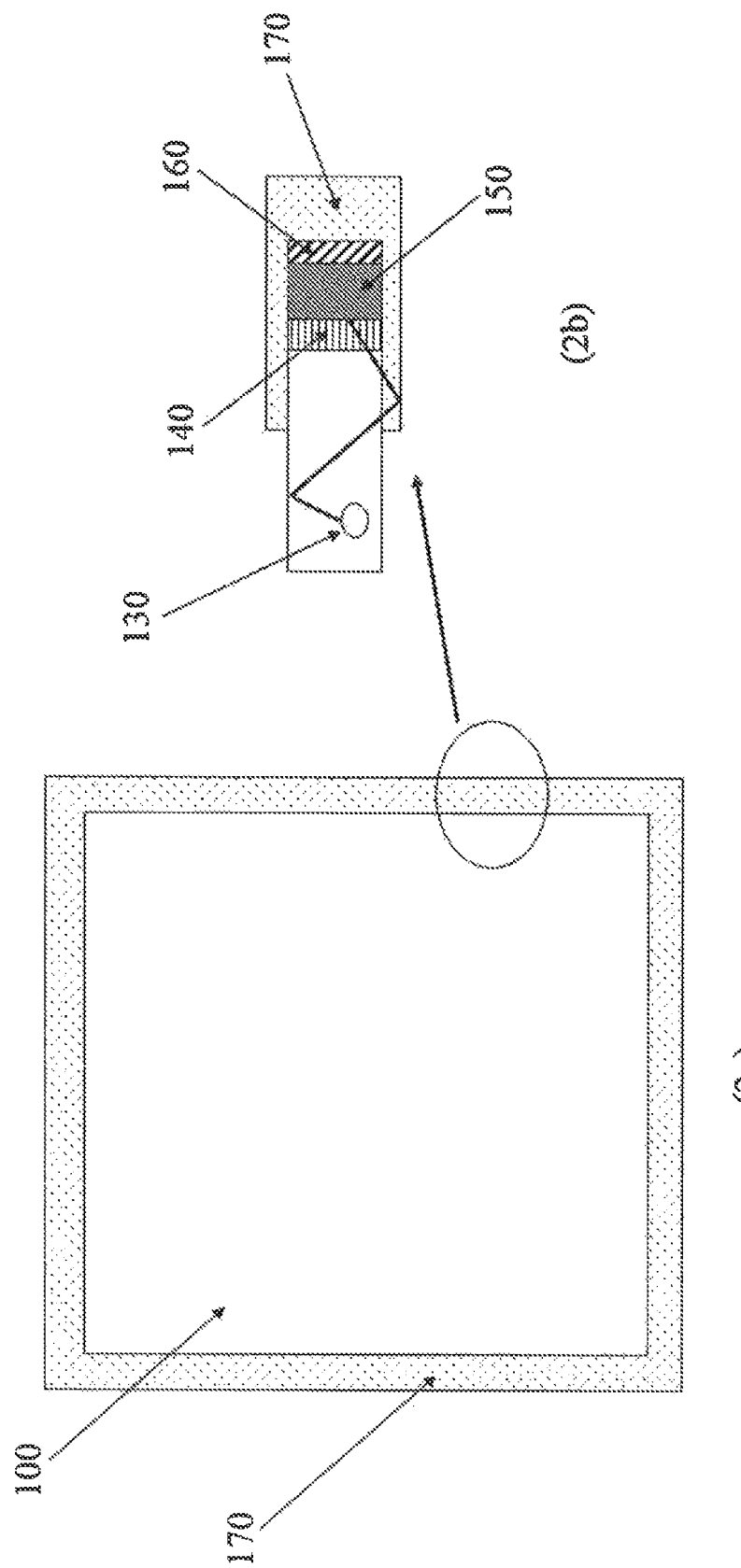

The present invention will now be illustrated in greater detail based on one embodiment, referring to FIG. 1 and to FIG. 2 presented hereunder.

Figure 1A:
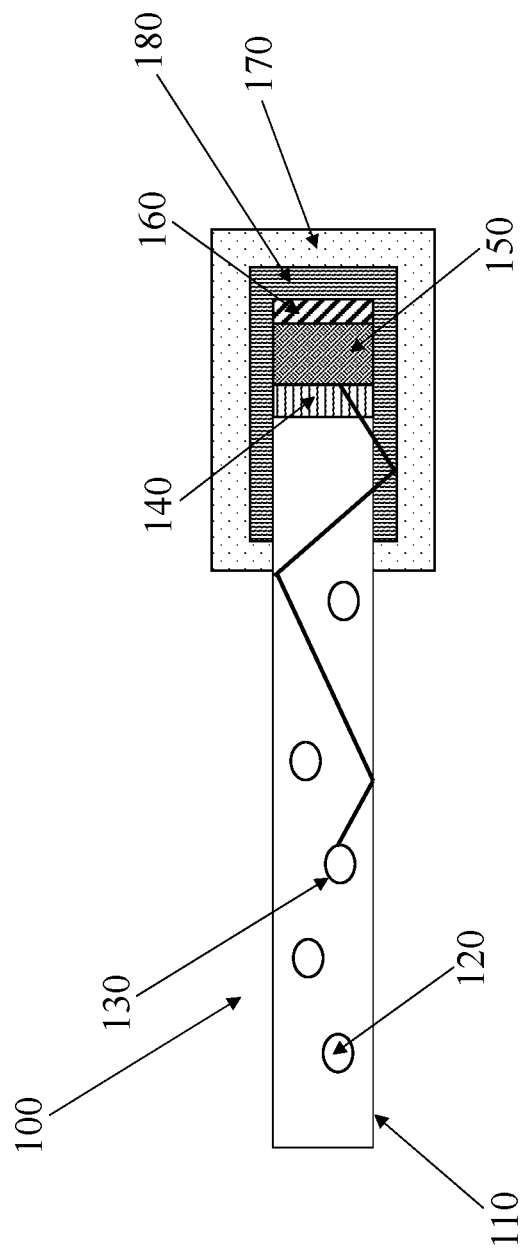

In particular, FIG. 1 represents a longitudinal and transversal section of a photovoltaic panel (or solar panel) (100) comprising: a luminescent solar concentrator (LSC) (110) including at least one photoluminescent compound (120); a photovoltaic cell (or solar cell) (150); a rigid or semi-rigid support (160); a layer of transparent adhesive (140) that joins said photovoltaic cell (or solar cell) (150) to said luminescent solar concentrator (LSC) (110); a transparent frame (170) that covers said rigid or semi-rigid support (160), said photovoltaic cell (or solar cell (150), said layer of transparent adhesive (140) and part of said luminescent solar concentrator (LSC). FIG. 1a is identical to FIG. 1 except for illustrating the optional transparent protective shell placed between said transparent frame (170) and said rigid support (160). In FIGS. 1 and 1a, an incident photon (130) having a first wavelength enters the luminescent solar concentrator (LSC) (110) and is absorbed by the photoluminescent compound (120) and emitted at a second wavelength different from the first. The incident photons are reflected internally and refracted inside the luminescent solar concentrator (LSC) until they reach the photovoltaic cell (or solar cell) (150) and are converted into electrical energy.

FIG. 2 represents a front view (2a) of a photovoltaic panel (or solar panel) (100) comprising a transparent frame (170) placed on the outside of the four outer sides of said photovoltaic panel (or solar panel) and a longitudinal and transversal section (2b) of said photovoltaic panel (or solar panel) (100): the meaning of the numbers used corresponds to that given above for FIG. 1.

For better understanding of the present invention and for practical application thereof, some illustrative, non-limiting examples thereof are presented below. 4,7-di-(Thien-2'-yl)-

2,1,3-benzothiadiazole (DTB) was obtained as described in European patent EP 2 593 449 in the applicant's name.

EXAMPLE 1

A photovoltaic panel (Panel 1—invention) according to the present invention underwent outdoor measurements to verify the maintenance of performance.

For this purpose, IXYS-XOD17 photovoltaic cells, already provided with a rigid support made of FR4, having an area of 1.2 cm$^2$, were placed by means of a layer of transparent adhesive having a thickness of 0.5 mm (3M™ VHB™ 4910 from 3M) on the four outer sides of a plate of Altuglas VSUVT 100 polymethylmethacrylate (PMMA) (dimensions 50×50×0.6 mm) obtained by addition in the bulk of 100 ppm of 4,7-di-(thien-2'-yl)-2,1,3-benzothiadiazole (DTB) and 100 ppm of 9,10-diphenylanthracene (DPA) (Aldrich), followed by casting. Next, a transparent frame made of Altuglas VSUVT 100 polymethylmethacrylate (PMMA) having a thickness of 6 µm was fitted to cover the photovoltaic cells and small portion (3 mm) of the aforementioned plate of Altuglas VSUVT 100 polymethylmethacrylate (PMMA).

For comparative purposes, outdoor measurements were also performed on:
- a photovoltaic panel (Panel 2—comparative) that differed from that presented above by the presence of an opaque frame made of aluminium having a thickness of 8 mm to cover the photovoltaic cells and a small portion (3 mm) of the aforementioned plate of Altuglas VSUVT 100 polymethylmethacrylate (PMMA) and a 1-mm layer of silicone placed between the photovoltaic cells and said opaque frame;
- a photovoltaic panel (Panel 3—reference) that differed from the panels presented above, i.e. (Panel 1—invention) and (Panel 2—comparative), by the absence of the frame.

The photovoltaic performance of said photovoltaic cells was measured by applying an external voltage to each of said cells and measuring the photocurrent generated with a "Keithley 2602A" digital multimeter (3A DC, 10A Pulse), obtaining the following results:
Voc (open-circuit voltage) (Panel 3—reference)=5.24 V;
Voc (open-circuit voltage) (Panel 1—invention)=5.22 V;
Voc (open-circuit voltage) (Panel 2—comparative)=5.19 V;
Isc (short-circuit current) (Panel 3—reference)=0.82 A;
Isc (short-circuit current) (Panel 1—invention)=0.75 A;
Isc (short-circuit current) (Panel 2—comparative)=0.66 A;
Vmp (maximum-power-point voltage) (Panel 3—reference)=3.85 V;
Vmp (maximum-power-point voltage) (Panel 1—invention)=3.94 V;
Vmp (maximum-power-point voltage) (Panel 2—comparative)=3.90 V;
Imp (maximum-power-point current) (Panel 3—reference)=0.76 A;
Imp (maximum-power-point current) (Panel 1—invention)=0.70 A;
Imp (maximum-power-point current) (Panel 2—comparative)=0.64 V;
Pmp (power supplied at the maximum power point) (Panel 3—reference)=2.93 W;
Pmp (power supplied at the maximum power point) (Panel 1—invention)=2.76 W;
Pmp (power supplied at the maximum power point) (Panel 2—comparative)=2.50 W.

As can be seen from the results given above, the photovoltaic panel according to the present invention (Panel 1—invention) showed a decrease in photovoltaic performance, in particular in terms of Pmp (power supplied at the maximum power point) relative to the reference panel (Panel 3—reference) equal to about 6%, while the comparative photovoltaic panel (Panel 2—comparative) showed a decrease in photovoltaic performance in terms of Pmp (power supplied at the maximum power point) relative to the reference panel (Panel 3—reference) equal to about 15%. Moreover, with regard to the other values, the comparative photovoltaic panel (Panel 2—comparative) showed a larger decrease in values relative to the reference panel (Panel 3—reference) relative to the decrease in the values shown by the photovoltaic panel according to the present invention (Panel 1—invention).

The invention claimed is:

1. Photovoltaic panel comprising:
   at least one luminescent solar concentrator (LSC) having an upper surface, a lower surface and one or more outer sides;
   at least one photovoltaic cell placed on the outside of at least one of the outer sides or outside at least one part of the lower surface of said LSC;
   at least one rigid or semi-rigid support placed on the outside of said at least one photovoltaic cell, said at least one rigid or semi-rigid support being placed in direct contact with said at least one photovoltaic cell; and
   at least one transparent frame placed outside said at least one rigid or semi-rigid support, said at least one transparent frame being placed in direct contact with said at least one rigid or semi-rigid support,
   wherein the at least one transparent frame is in the form of a tape or film having a thickness from 10 µm to 1000 µm and made of a transparent material selected from the group consisting of PMMA, PC, polyisobutyl methacrylate, polyethyl methacrylate, polyallyl diglycol carbonate, polymethacrylimide, polycarbonate ether, polyethylene terephthalate, polyvinylbutyral, ethylene-vinyl acetate copolymers, ethylene-tetrafluoroethylene copolymers, polyimide, polyurethane, styrene-acrylonitrile copolymers, styrene-butadiene copolymers, polystyrene, methyl methacrylate styrene copolymers, polyether sulphone, polysulphone, cellulose triacetate, PMMA-IR, and mixtures thereof.

2. Photovoltaic panel according to claim 1, wherein said LSC has an upper surface configured to receive photons, a lower surface configured to receive photons, said upper surface being positioned closer to the source of photons than the lower surface and four outer sides extending from the upper surface to the lower surface.

3. Photovoltaic panel according to claim 1, wherein said LSC is a plate comprising a transparent material matrix and at least one photoluminescent compound.

4. Photovoltaic panel according to claim 3, wherein said transparent material is selected from: polymethylmethacrylate (PMMA), polycarbonate (PC), polyisobutyl methacrylate, polyethyl methacrylate, polyallyl diglycol carbonate, polymethacrylimide, polycarbonate ether, polyethylene terephthalate, polyvinylbutyral, ethylene-vinyl acetate copolymers, ethylene-tetrafluoroethylene copolymers, polyimide, polyurethane, styrene acrylonitrile copolymers, styrene-butadiene copolymers, polystyrene, methyl methacrylate styrene copolymers, polyether sulfone, polysulfone, cellulose triacetate, transparent and impact-resistant crosslinked acrylic compositions consisting of a fragile matrix (I) having a glass transition temperature (Tg) of less than 0° C. and elastomeric domains having dimensions smaller than 100 nm consisting of macromolecular sequences (II) having a flexible nature with a Tg of less than 0° C. (hereinafter indicated, for greater simplicity as PMMA-IR), and mixtures thereof; transparent glasses such as silica, quartz, alumina, titania, and mixtures thereof.

5. Photovoltaic panel according to claim 3, wherein said photoluminescent compound is selected from: perylenic compounds; acenic compounds; benzothiadiazole compounds; compounds comprising a benzoheterodiazole group and at least one benzodithiophene group; disubstituted naphthothiadiazole compounds; benzoheterodiazole compounds disubstituted with benzodithiophene groups; disubstituted benzoheterodiazole compounds; disubstituted diaryloxybenzoheterodiazole compounds, and mixtures thereof.

6. Photovoltaic panel according to claim 3, wherein said photoluminescent compound is present in said transparent matrix in an amount ranging from 0.1 g per unit area to 3 g per unit area, said unit area being relative to the area of the matrix of transparent material expressed in m2.

7. Photovoltaic panel according to claim 3, wherein said photoluminescent compound is selected from quantum dots (QDs) consisting of elements or combinations of elements selected from groups 12-16 of the Periodic Table of Elements.

8. Photovoltaic panel according to claim 7, wherein said photoluminescent compound selected from QDs is presented in said transparent matrix in an amount ranging from 0.05 g per unit area to 100 g per unit area, said unit area being relative to the area of the matrix of transparent material expressed in m2.

9. Photovoltaic panel according to claim 1, wherein said LSC is a plate having a thickness ranging from 0.1 µm to 50 mm.

10. Photovoltaic panel according to claim 1, wherein the electricity generated by said at least one photovoltaic cell or solar cell is transported by means of a wiring system that is connected to said photovoltaic panel or solar panel.

11. Photovoltaic panel according to claim 1, wherein said photovoltaic panel comprises at least one electrical conduit comprising electrical wires, conductive polymers, or carbon fibres connected to said at least one photovoltaic cell or solar cell, said at least one electric conduit being able to carry electrical energy generated by said at least one photovoltaic cell.

12. Photovoltaic panel according to claim 1, wherein said at least one rigid or semi-rigid support is selected from aluminium, tin, ceramic, plastic, FR4 of the National Electrical Manufacturers Association (NEMA) and combinations thereof.

13. Photovoltaic panel according to claim 1, wherein at least one transparent adhesive layer is placed between said at least one photovoltaic cell and said LSC.

14. Photovoltaic panel according to claim 13, wherein:
said at least one transparent adhesive layer comprises at least one compound selected from: rubbers, acrylic compounds, silicones, vinyl alkyl ethers, polyesters, polyamides, urethane, epoxy compounds, ethylene vinyl acetate, polyethylene terephthalate, PMMA, polyvinyl butyral, tetrafluoroethylene, polyimides, amorphous polycarbonate, polystyrene, siloxanes, sol-gel, polyurethanes, polyacrylates, and mixtures thereof; and/or said at least one transparent adhesive layer is in the form of tape or film; and/or
said at least one transparent adhesive layer has a thickness ranging from 1 µm to 2000 µm; and/or
said at least one transparent adhesive layer has a refractive index ranging from 1.30 to 1.70.

15. Photovoltaic panel according to claim 1, wherein:
the material of the transparent frame has a refractive index between 1.30 and 1.70.

16. Photovoltaic panel according to claim 1, wherein said at least one transparent frame covers (A) at least part of said at least one rigid or semi-rigid support, wherein the at least one transparent frame is in direct contact with said at least one rigid or semi-rigid support, or
(B) said at least one rigid or semi-rigid support and at least part of said at least one photovoltaic cell, wherein the at least one transparent frame is in direct contact with said at least one rigid or semi-rigid support and said at least one photovoltaic cell, or
(C) said at least one rigid or semi-rigid support, said at least one photovoltaic cell and at least part of said LSC, wherein said at least one transparent frame is in direct contact with said at least one rigid or semi-rigid support, said at least one photovoltaic cell and said LSC.

17. Photovoltaic panel according to claim 1, wherein said at least one transparent protective shell covers
(A) at least part of said at least one rigid or semi-rigid support, wherein said at least one transparent protective shell is in direct contact with said at least one rigid or semi-rigid support, or
(B) said at least one rigid or semi-rigid support and at least part of said at least one photovoltaic cell or solar cell, wherein said at least one transparent protective shell is in direct contact with said at least one rigid or semi-rigid support and said at least one photovoltaic cell or solar cell, or
(C) said at least one rigid or semi-rigid support, said at least one photovoltaic cell (or solar cell) and at least part of said photovoltaic LSC, wherein said at least one transparent protective shell is in direct contact with said at least one rigid or semi-rigid support and said at least one photovoltaic cell or solar cell and with said LSC.

18. Photovoltaic panel according to claim 1 comprising at least one transparent protective shell positioned between said at least one transparent frame and said at least one rigid or semi-rigid support, said at least one transparent protective shell being placed in direct contact with said at least one rigid or semi-rigid support and said at least one transparent frame.

19. Photovoltaic panel according to claim 18, wherein:
said at least one transparent protective shell comprise a transparent material selected from PMMA, PC, polyisobutyl methacrylate, polyethyl methacrylate, polyallyl diglycol carbonate, polymethacrylimide, polycarbonate ether, polyethylene terephthalate, polyvinylbutyral, ethylene-vinyl acetate copolymers, ethylene-tetrafluoroethylene copolymers, polyimide, polyurethane, styrene-acrylonitrile copolymers, styrene-butadiene copolymers, polystyrene methyl methacrylate styrene copolymers, polyether sulphone, polysulphone, cellulose triacetate, PMMA-IR, and mixtures thereof; and/or
said transparent material has a refractive index ranging from 1.30 to 1.70; and/or
said at least one transparent protective shell is in the form of tape or film; and/or said at least one transparent protective shell has a thickness ranging from 1 μm to 1000 μm, preferably ranging from 10 μm to 500 μm.

20. Method for assembling a photovoltaic panel according to claim 1, comprising:
preparing the LSC having an upper surface, a lower surface and one or more outer sides;
optionally, milling and/or drilling the outer side(s) or at least a portion of the lower surface of said LSC;
optionally, applying at least one layer of transparent adhesive on the outer side(s) or on at least one part of the lower surface of said LSC;
applying on the outer side(s) or on the outside of at least one part of the lower surface of said LSC, or on said at least one layer of transparent adhesive, the at least one photovoltaic cell or solar cell, said photovoltaic cell or solar cell preferably being positioned beforehand on the rigid or semi-rigid support;
applying the at least one rigid or semi-rigid support on said at least one photovoltaic cell or solar cell;
fitting a wiring system by automated welding to form a whole;
placing the whole in an injection moulding press;
moulding the at least one transparent frame, or moulding the at least one transparent protective shell and then at least one transparent frame.

* * * * *